(12) United States Patent
Iwami

(10) Patent No.: US 9,269,577 B2
(45) Date of Patent: Feb. 23, 2016

(54) METHOD FOR MANUFACTURING NITRIDE SEMICONDUCTOR DEVICE

(71) Applicant: FURUKAWA ELECTRIC CO., LTD., Tokyo (JP)

(72) Inventor: Masayuki Iwami, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 93 days.

(21) Appl. No.: 14/062,304

(22) Filed: Oct. 24, 2013

(65) Prior Publication Data

US 2014/0120703 A1 May 1, 2014

(30) Foreign Application Priority Data

Oct. 26, 2012 (JP) ................ 2012-237246

(51) Int. Cl.
*H01L 21/20* (2006.01)
*H01L 21/36* (2006.01)
(Continued)

(52) U.S. Cl.
CPC ...... *H01L 21/02664* (2013.01); *H01L 21/0242* (2013.01); *H01L 21/0254* (2013.01); *H01L 21/0262* (2013.01); *H01L 21/02381* (2013.01); *H01L 21/02389* (2013.01); *H01L 21/02458* (2013.01); *H01L 21/02576* (2013.01); *H01L 21/02579* (2013.01); *H01L 21/02581* (2013.01);
(Continued)

(58) Field of Classification Search
CPC .................................................. H01L 21/02664
USPC ........................................................ 438/478
See application file for complete search history.

(56) References Cited

U.S. PATENT DOCUMENTS 6,218,269 B1 * 4/2001 Nikolaev et al. ............... 438/518
6,242,328 B1 * 6/2001 Shin .............................. 438/518
(Continued)

FOREIGN PATENT DOCUMENTS

JP 3223295 B2 10/2001
JP 3322179 B2 9/2002
(Continued)

OTHER PUBLICATIONS

D.S. Green, et al., "Polarity control during molecular beam epitaxy growth of Mg-doped GaN", Journal of Vacuum Science & Technology B, vol. 21, 2003, 9 pages.
(Continued)

*Primary Examiner* — Matthew Landau
*Assistant Examiner* — Igwe U Anya
(74) *Attorney, Agent, or Firm* — Oblon, McClelland, Maier & Neustadt, L.L.P.

(57) ABSTRACT

Forming a group III nitride semiconductor layer having p-type conductivity on at least one layer or more formed on an Si substrate or sapphire substrate using at least one of an epitaxial growth or ion implantation method. When forming the group III nitride semiconductor layer, at least one type of metal element selected from Zn, Li, Au, Ag, Cu, Pt, and Pd having a formation energy of a group III element substitute higher than that of Mg is doped simultaneously with Mg of a p-type dopant to introduce an interstitial site. Subsequent to activation of Mg as an acceptor, the metal element is removed from the group III nitride semiconductor layer, and the concentration of the metal element is not more than $1/100$ of the concentration of Mg to realize a hole concentration of not less than $10^{18}$ to $10^{19}$ cm$^{-3}$.

7 Claims, 8 Drawing Sheets

(51) Int. Cl.
- H01L 21/02 (2006.01)
- H01L 29/66 (2006.01)
- H01L 29/778 (2006.01)
- H01L 29/861 (2006.01)
- H01L 29/207 (2006.01)
- H01L 33/00 (2010.01)
- H01L 29/20 (2006.01)

(52) U.S. Cl.
CPC ........ *H01L 29/207* (2013.01); *H01L 29/66204* (2013.01); *H01L 29/66462* (2013.01); *H01L 29/7787* (2013.01); *H01L 29/861* (2013.01); *H01L 33/007* (2013.01); *H01L 29/2003* (2013.01)

(56) References Cited

U.S. PATENT DOCUMENTS

| | | |
|---|---|---|
| 7,898,002 B2 | 3/2011 | Hikita et al. |
| 8,072,002 B2 | 12/2011 | Niyama et al. |
| 8,164,115 B2 | 4/2012 | Hikita et al. |
| 8,309,988 B2 | 11/2012 | Niiyama et al. |
| 2002/0113235 A1* | 8/2002 | Udagawa ............... 257/59 |
| 2004/0058465 A1* | 3/2004 | Taki ........................ 438/22 |
| 2004/0119081 A1* | 6/2004 | Takemi et al. ........... 257/85 |
| 2007/0131160 A1* | 6/2007 | Slack et al. ............. 117/106 |
| 2010/0096650 A1* | 4/2010 | Ubahara ................... 257/94 |
| 2010/0147835 A1* | 6/2010 | Mulpuri et al. ......... 219/759 |

FOREIGN PATENT DOCUMENTS

| | | |
|---|---|---|
| JP | 3461112 B2 | 10/2003 |
| JP | 4124156 B2 | 7/2008 |
| JP | 2008-311392 | 12/2008 |
| JP | 2009-246292 | 10/2009 |
| JP | 2010-232279 | 10/2010 |
| JP | 4755961 B2 | 8/2011 |

OTHER PUBLICATIONS

Sukit Limpijumnong, et al., "Diffusivity of native defects in GaN", Physical Review, B vol. 69, 2004, 11 pages.

S.B. Zhang, et al., "Chemical Potential Dependence of Defect Formation Energies in GaAs: Application to Ga Self-Diffusion", Physical Review Letters, vol. 67, No. 17, Oct. 21, 1991, 4 pages.

* cited by examiner

METHOD FOR MANUFACTURING NITRIDE SEMICONDUCTOR DEVICE

BACKGROUND

1. Technical Field

The present invention relates to a method for manufacturing a nitride semiconductor device, such as a light emitting element or an electronic device that uses a group III nitride semiconductor having a p-type conductivity.

2. Background Art

A group III nitride semiconductor is primarily a gallium nitride (GaN), aluminum nitride (AlN), indium nitride (InN), or a mixed crystal of these.

This nitride semiconductor is used in light emitting diodes (LED), laser diodes (LD), and other light emitting devices, as well as in Schottky barrier diodes (SBD), field effect transistors (FET), and other electronic devices for power device applications.

n-type and p-type conductivity control is possible with these types of nitride semiconductors when using silicon (Si) or magnesium (Mg) as a dopant. Specifically, a desired emission can be obtained by forming a pn junction in a light emitting device and implanting electrons and holes in a quantum well layer for recombination. For these types of light emitting devices, it is desired to realize low resistance ohmic contact and to realize a high hole concentration ($p^+$ layer) for performance improvement, namely, a reduction of forward resistance.

Further, for electronic devices, FETs using an AlGaN/GaN heterostructure (AlGaN/GaN-HFET) utilize a two-dimensional electron gas of high concentration generated at the AlGaN/GaN interface to realize a semiconductor element with low on-resistance. A method to realize high withstand voltage in these types of electronic devices by arranging a body electrode in a $p^+$ layer by forming the $p^+$ layer in the element is known (Japanese Unexamined Patent Application Publication No. 2010-232279A). That is, withstand voltage can be improved by removing, from the body electrode, the hole from the electron hole pair generated by an avalanche phenomenon that occurs when the drain voltage is high.

However, there are concerns about safety when a malfunction occurs in the power supply circuit due to the normally-on characteristic in the AlGaN/GaN-HFET described above. When considering a failsafe, normally-off is desired in the semiconductor element.

Known examples of normally-off methods include arranging p-type GaN under the gate electrode in a GaN based MOSFET (Japanese Unexamined Patent Application Publication No. 2008-311392A and Japanese Unexamined Patent Application Publication No. 2009-246292A) or in an AlGaN/GaN-HFET structure (Japanese Patent No. 4755961B).

In a group III nitride semiconductor, Mg functions as an acceptor by substituting in the group III site. When forming a p-type GaN layer using a metal organic chemical vapor deposition (MOCVD) method, Mg can introduce biscyclopentadienylmagnesium ($Cp_2$ Mg) as a source gas. In this case, because Mg forms a compound with hydrogen (Mg—H), the activation rate as an acceptor decreases.

Further, the acceptor level produced by Mg in the GaN layer (Ga substitute; $Mg_{Ga}$) is positioned at about 170 meV from the valence band so an ionization rate of only a few percent can be expected at room temperature. Mg—H can be broken down after crystal growth by heat treatment and/or irradiating with a thermal neutron beam (Japanese Patent No 4124156B). However, the ionization rate is a physically determined amount and there is no room for artificial improvements. Accordingly, in order to obtain a high hole concentration of approximately $10^{18}$ to $10^{19}$ $cm^{-3}$, Mg doping that exceeds $10^{20}$ to $10^{21}$ $cm^{-3}$ is required.

For this, with the conventional technique, Mg is doped independently during crystal growth of GaN. Therefore, Mg doping is limited after Ga site substitution from approximately the latter half of $10^{19}$ $cm^{-3}$ to the first half of $10^{20}$ $cm^{-3}$. This is because the Mg, when doping in high concentration, either enters an interstitial site or forms a nitrogen vacancy ($V_N$) due to a self-compensation effect exhibited by n-type conductivity. Mg that has entered an interstitial site adversely affects electrical characteristics due to segregation in low angle grain boundaries and threading dislocation in the crystal and on the surface.

Further, it is known that when Mg is segregated into GaN bulk, an anti-phase boundary is formed causing polarity to reverse (D. S. Green, E. Haus, F. Wu, L. Chen, U. K. Mishra, and J. S. Speck, Journal of Vacuum Science & Technology B 2003, vol. 21, pg. 1804). When polarity is reversed, the crystal quality of the GaN layer epitaxially grown further above that region is significantly lower. Moreover, because Ga interstitial atoms are also formed in addition to nitrogen vacancy ($V_N$), there are problems that bring about a current collapse phenomenon and characteristic fluctuation in the electronic device. Therefore, realizing a p-type GaN layer that provides the quality required by an electronic device has been difficult in a GaN based electronic device.

In response to this, a technique for simultaneously doping Si and oxygen (O), which is an n-type dopant, has been proposed as a method for introducing a high concentration of Mg (Japanese Patent No. 3223295B). According to the technique described in Japanese Patent No. 3223295B, doping with an n-type dopant and a p-type dopant in a ratio of 1:2 forms an Si—$Mg_2$ pair in GaN to effectively function as an acceptor.

However, formation control of this type of donor-acceptor pair is difficult, and the above method has a problem in that an n-type dopant present alone may be introduced. When an n-type dopant remains, hole concentration is reduced. Further, the Si—$Mg_2$ pair is formed not only at the low acceptor level but also at a deep level. Furthermore, because the deep level introduces the current collapse phenomenon, it is not suitable for electronic device applications.

Additionally, similar to the technique described in Japanese Patent No. 3223295B, there is a report where high hole concentrations have been realized by simultaneously doping an n-type dopant and a p-type dopant (Japanese Patent No. 3322179B). Japanese Patent No. 3322179B describes that simultaneously doping Mg with an n-type dopant relaxes distortion around Mg so that Mg does not enter an interstitial site and promotes the formation of $Mg_{Ga}$. However, in order to obtain a hole concentration of $10^{19}$ $cm^{-3}$, an n-type dopant (Si) must be introduced in a range of $1/10$ to $1/2$ of Mg. Because this n-type dopant remains in GaN, it has a problem in that the element characteristics fluctuate due to external disturbances such as electrification.

Further, in contrast to Japanese Patent No. 3223295B and Japanese Patent No. 3322179B, testing has been conducted to try to improve hole concentration by simultaneously doping two types of p-type dopants (Japanese Patent No. 3461112B). Japanese Patent No. 3461112B describes that simultaneously doping Zn that forms an acceptor level deeper than Mg increases hole concentration as a result of compensating for n-type residual carriers. However, because $10^{18}$ $cm^{-3}$ or more of Zn remains in the GaN with this method, the problem of bringing about the current collapse phenomenon in the electronic device remains.

Concerning the request for a normally-off AlGaN/GaN-HFET, a technique that forms a p-type GaN layer on AlGaN is known as described in Japanese Patent No. 4755961B. However, in order to obtain desired characteristics in the AlGaN/GaN-HFET, the acceptor amount must be increased such that the layer thickness of the p-type GaN layer must be at least 15 nm. On account of this, there is a problem in that leakage current increases through the p-type GaN layer.

In light of the above, an object of the present invention is to provide a method for manufacturing a nitride semiconductor device that can effectively dope magnesium of a p-type dopant and that can realize a high acceptor concentration and a high hole concentration in a group III nitride semiconductor.

SUMMARY

In order to resolve the problems described above and to achieve the above object, a method for manufacturing a nitride semiconductor device of the present invention is a method for manufacturing a nitride semiconductor device that has a substrate and a group III nitride semiconductor layer having p-type conductivity on at least one layer or more formed on the substrate, and the method includes forming the group III nitride semiconductor layer having the p-type conductivity by simultaneously doping magnesium of a p-type dopant and a metal element having a formation energy of a group III element substitute higher than that of the magnesium and introducing the metal element to an interstitial site in the group III nitride semiconductor layer.

The method for manufacturing a nitride semiconductor device according to the present invention is characterized in that, in the above invention, the metal element is removed from the group III nitride semiconductor layer at the time of activating magnesium as an acceptor or thereafter, and a concentration of the metal element in the group III nitride semiconductor layer is not more than $1/100$ of the concentration of the magnesium in the group III nitride semiconductor layer. Further, the method for manufacturing a nitride semiconductor device according to the present invention is characterized in that, in this configuration, the process for removing the metal element from the group III nitride semiconductor layer is a heat treatment process. Furthermore, the method for manufacturing a nitride semiconductor device according to the present invention is characterized in that, in the heat treatment process of this configuration, the substrate is cooled to form a temperature gradient in the nitride semiconductor device.

The method for manufacturing a nitride semiconductor device according to the present invention is characterized in that, in the above invention, the metal element is at least one type of element selected from Zn, Li, Au, Ag, Cu, Pt, and Pd.

The method for manufacturing a nitride semiconductor device according to the present invention is characterized in that, in the above invention, the group III nitride semiconductor layer having p-type conductivity is any one of GaN, AlN, or InN, or a mixed crystal composed of a combination of any two types selected from GaN, AlN, and InN.

The method for manufacturing a nitride semiconductor device according to the present invention is characterized in that, in the above invention, the nitride semiconductor device is a rectifier diode, field effect transistor, or light emitting device.

The method for manufacturing a nitride semiconductor device according to the present invention can effectively dope magnesium of a p-type dopant and can realize a high acceptor concentration and a high hole concentration in a group III nitride semiconductor.

DETAILED DESCRIPTION

Figure 1A:
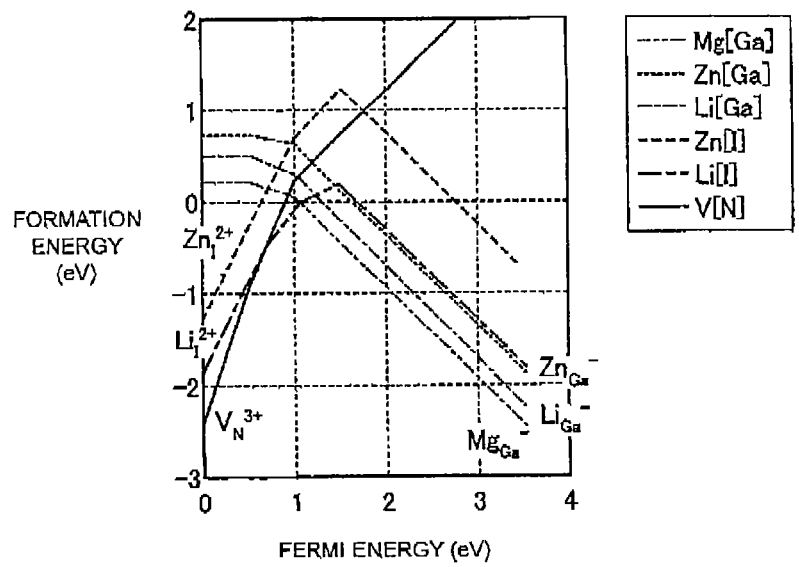
FIG. 1A is a graph showing formation energy of impurity atoms in a Ga rich condition of a $p^+$-GaN layer according to an embodiment of the present invention.

Next, embodiments of the present invention will be described while referring to the drawings. Note that, the same reference numerals will be applied to the same or corresponding portions in all drawings in the following embodiments. Further, the present invention is not limited by the embodiments described below. Here, in order to simplify understanding of the present invention, the extensive studies conducted by the inventors to resolve the above problems will be described when describing the embodiments of the present invention.

(Characteristics Evaluation Using First-Principles Electronic Structure Calculation)

In other words, the inventors conducted first-principles electronic structure calculations (simulations) to confirm the formation energy of metal impurity X with Mg in a GaN crystal. The results of such will be described below. Note that the simulations were performed using an Advance/PHASE made by AdvanceSoft Corporation. Further, the calculations were performed using a Vanderbilt Ultrasoft pseudopotential.

The exchange interaction was calculated in a range of a generalized gradient approximation. The simulation was performed assuming a charged state to evaluate the formation energy. In other words, the total energy $E_{tot}$ of the system is evaluated by adjusting by adding to or taking away from the number of electrons (S. B. Zhang and J. E. Northrup, Physical Review Letters 1991, vol. 67, pg. 2339) in a state where a charge required to maintain electrical neutrality exists in the background.

The formation energy $E_{form}$ per unit cell of impurity atom depends on the charge state q of the system and on the Fermi energy $E_f$, and is expressed by the following equation (1).

[Equation 1]

$$E_{form}(q,E_f)=E_{tot}[\text{impurity}](q)-E_{tot}[\text{bulk}]-\Sigma\mu_n+qE_f \quad (1)$$

Note that $\mu_n$ is the chemical potential of element n, and the value thereof differs for Ga rich and N rich growth conditions. Further, the main calculation condition is as follows.

Atomic Model: 33 atoms (16 gallium, 16 nitrogen, 1 impurity atom)
Cut-off Energy: the wave function and the charge density distribution are respectively 25 Ry and 230 Ry
k Point Sample: 3×3×4
Calculated Number of Bands: 220

Figure 1B:
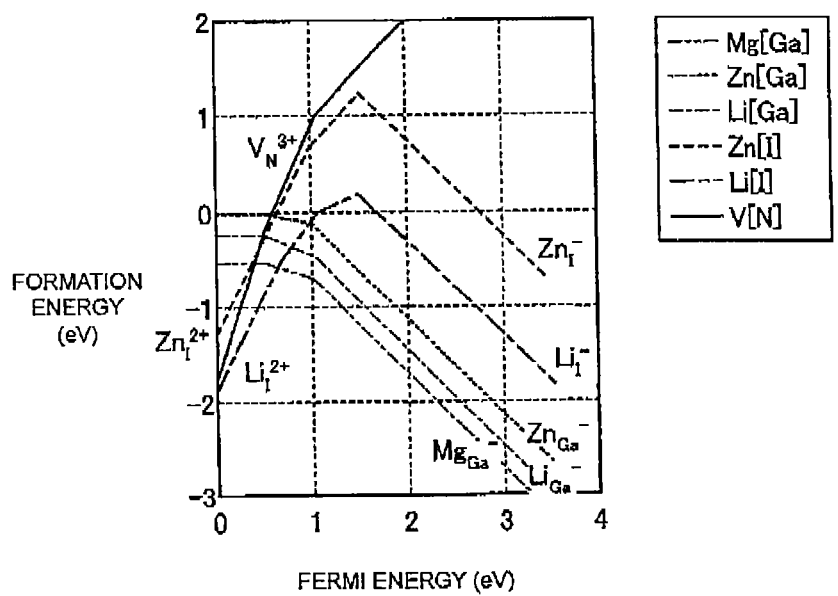
FIG. 1B is a graph showing formation energy of impurity atoms in an N rich condition of a $p^+$-GaN layer according to an embodiment of the present invention.

FIG. 1A is a graph showing Fermi energy dependence of the formation energy of impurity atoms (Mg, Zn, and Li) in GaN in a Ga rich condition. FIG. 1B is a graph showing Fermi energy dependence of the formation energy of impurity atoms (Mg, Zn, and Li) in GaN in an N rich condition. FIGS. 1A and 1B both show the formation energy of nitrogen vacancy $V_N$ for comparison. Note that the slope of the Fermi energy dependence in the formation energy is the charge state, and a positive slope is a donor and the negative slope is an acceptor.

As shown in FIG. 1A, when Fermi energy $E_f$ is close to a conduction band ($E_f$ is near 3 eV; n-type GaN), the formation energy of $Mg_{Ga}^-$ is the lowest to become a monovalent acceptor. When lowering the Fermi energy $E_f$ to approach 0, in other words, as the concentration of Mg increases, the formation energy of $Mg_{Ga}^-$ increases monotonically, and in the region where $E_f$ is 1 eV or below, it reverses to a formation energy of $V_N^{3+}$ (trivalent donor). Further, $Mg^0$ (neutral) is stable. Therefore, adding additional amounts of Mg does not increase the acceptor concentration. This is known as the self-compensation effect.

When Li or Zn is doped in GaN and the Fermi energy is near the conduction band, it substitutes independently in the Ga site in the same way as Mg ($Li_{Ga}$, $Zn_{Ga}$) to become a monovalent acceptor. However, Li and Zn have higher formation energy than $Mg_{Ga}$. Therefore, when simultaneously doping Li or Zn with Mg, because the Ga site to be substituted is already occupied by Mg, it enters an interstitial state (formation of $Li_I$ and $Zn_I$). As with the p-type GaN, when $E_f$ is close to a valence band, $Li_I$ and $Zn_I$ become divalent donors.

Figure 2:
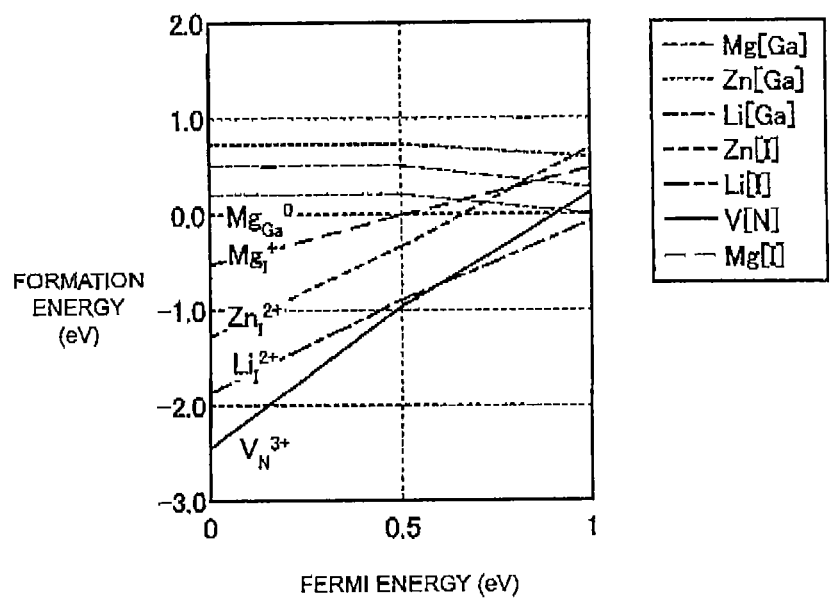
FIG. 2 is a graph showing details of a low Fermi energy in the formation energy of impurity atoms in the Ga rich condition of the $p^+$-GaN layer shown in FIG. 1A.

FIG. 2 is a graph showing details of the formation energy of impurities near the valence band of FIG. 1A. Note that, in FIG. 2, the formation energy of $Mg_I$ is also given. As described above, when Mg is doped alone and the doping amount is increased, Mg may enter an interstitial site to form $Mg_I$. However, from FIG. 2, the inventors recalled that the likelihood of Mg entering an interstitial site and forming $Mg_I$ can be reduced when simultaneously doping Li or Zn with Mg. In other words, the inventors found that because the formation energy of $Mg_I^+$, which is a monovalent donor, is higher than the formation energy of both $Zn_I^{2+}$ and $Li_I^{2+}$, Mg stays in the Ga site even when doping with a high concentration of Mg.

Figure 3A:
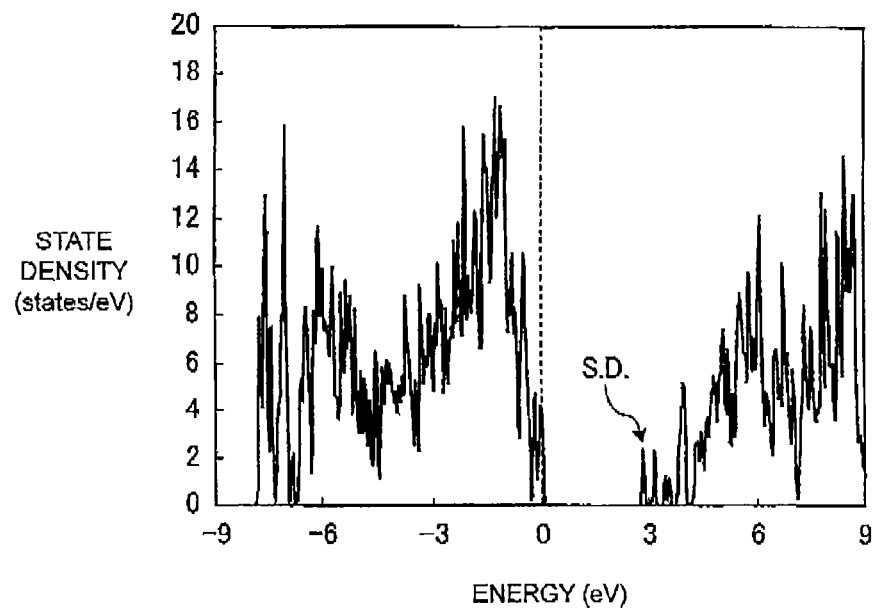
FIG. 3A is a graph showing energy dependence of the density of states in zinc (Zn) interstitial atoms according to an embodiment of the present invention.
Figure 3B:
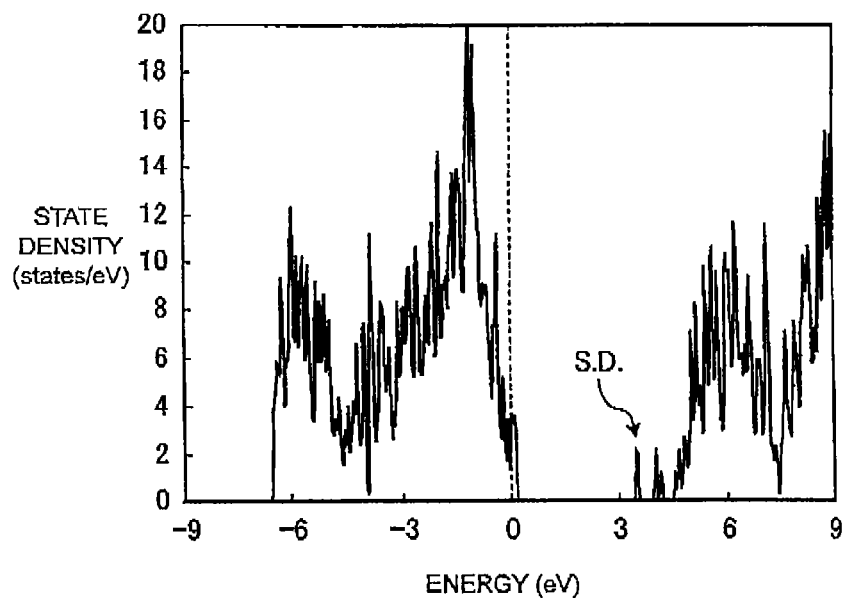
FIG. 3B is a graph showing energy dependence of the density of states in lithium (Li) interstitial atoms according to an embodiment of the present invention.

FIGS. 3A and 3B both show calculation results for the density of states (DOS) of $Zn_I^{2+}$ and $Li_I^{2+}$. Only the spin upward is shown here, but the spin downward produced similar results. From FIGS. 3A and 3B, it can be seen that both $Li_I$ and $Zn_I$ are formed in a shallow donor level (S.D.) below the conduction band. Because the Fermi energy of the system increases at this time, the formation energy of $Mg_{Ga}^-$ lowers to enable a high acceptor concentration to be realized.

Further, from FIG. 1B, under N rich conditions and under Ga rich conditions, similarly, the formation energy for $Li_{Ga}$ and $Zn_{Ga}$ is higher than that of $Mg_{Ga}$. Therefore, when doping these simultaneously, while Mg substitutes in the Ga site, Li and Zn enter into an interstitial site, and the Fermi energy of the system increases. Therefore, because the formation energy of $Mg_{Ga}^-$ is lower, it is understood that a high acceptor concentration can be realized.

Furthermore, from FIG. 1B, the inventors found that the formation energy of $Li_I^{2+}$ and $Zn_I^{2+}$ is approximately the same or lower than the formation energy of $V_N^{3+}$. Therefore, the inventors recalled that the self-compensation effect due to $V_N$ formation can be suppressed, under N rich conditions, by simultaneously doping Li or Zn with Mg. Furthermore, from FIG. 1B, it can also be understood that removal after p-type GaN formation becomes easier because the formation energy of $Li_I^-$ and $Zn_I^-$ formed when the Fermi energy is close to the conduction band are respectively higher and unstable compared to the formation energy of $Li_{Ga}^-$ and $Zn_{Ga}^-$.

The simulations described above were performed on GaN, but similar results were obtained when substituting In and Al for all or a part, specifically up to approximately ½, of the Ga atoms.

In the foregoing, a description was given for results of Zn and Li as an example of the dopant that simultaneously dopes with Mg, but similar results are obtained using Au, Ag, Cu, Pt, and Pd. In other words, it can be understood that simultaneously doping with Mg a metal impurity X (X=Li, Zn, Au, Ag, Cu, Ft, and Pd) that enters an interstitial site when doped simultaneously with Mg is desired to raise the Fermi energy of the system and lower the formation energy for Ga substitution by Mg.

Specifically, with the independent introduction of Mg into GaN, Mg substitutes in the Ga site to form an acceptor level (p-type dopant). Therefore, a metal impurity X with a higher formation energy than the formation energy of $Mg_{Ga}$ is simultaneously doped with Mg in at least one of during ion implantation and/or at the time of epitaxial growth. At this time, because the metal impurity X simultaneously doped with Mg enters into an interstitial site, an n-type conductivity is exhibited at this time (donor supply). In other words, the Fermi energy of the system increases, and the formation energy of $Mg_{Ga}$ decreases. As a result, it is possible that a high concentration $Mg_{Ga}$ (acceptor) can be formed, and a high hole concentration can be obtained. In addition, there is also the benefit that the layer thickness to obtain the same number of carriers as conventionally can be made smaller.

Further, removing the metal impurity doped at the same time with Mg after formation of the doped GaN layer, that is at a predetermined time after doping the metal impurity and Mg onto the GaN layer, prevents adverse effects on the electrical characteristics. Generally, diffusion energy of an interstitial metal impurity in GaN is low (S. Limpijumnong and C. G. Van de Walle, Physical Review B 2004, vol. 69, pg. 035207). Therefore, this impurity can be easily removed by a heat treatment process or the like after crystal growth that includes activation of the acceptor or the thermal history in crystal growth. That is, the metal impurity can be removed at the time that Mg is activated as an acceptor or after it has been activated. Here, examples of the metal impurity X having these types of characteristics include Zn, Li, Au, Ag, Cu, Pt, Pd and the like.

The present invention has been proposed based on the extensive research by the inventors as described above. Accordingly, embodiments of the present invention will be described in order below.

First Embodiment

Figure 4:
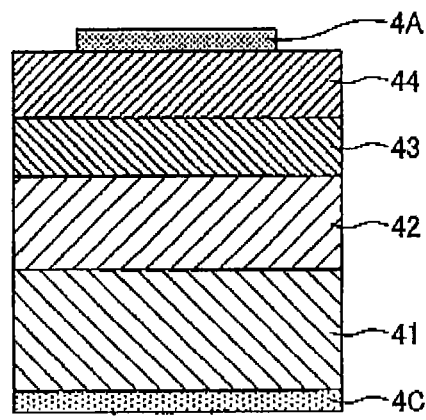
FIG. 4 is a cross-sectional view illustrating a vertical type pn diode according to a first embodiment of the present invention.

First, a description will be given of a nitride semiconductor device according to a first embodiment of the present invention. FIG. 4 illustrates a vertical type rectifier (pn junction) diode as the nitride semiconductor device according to the first embodiment.

As illustrated in FIG. 4, the pa junction diode is configured by sequentially layering an n$^-$-GaN layer 42, p-GaN layer 43, p$^+$-GaN layer 44, and an anode electrode 4A on one main surface of an n$^+$-GaN substrate 41, and a cathode electrode 4C is provided on another main surface of the n$^+$-GaN substrate 41. The following is a description of a manufacturing method of the vertical type pn junction diode as configured above according to the first embodiment.

(Epitaxial Substrate Production)

First, the n$^+$-GaN substrate 41 with a thickness of 300 μm and a 2 inch diameter having n$^+$ conductivity is installed in an MOCVD apparatus (not illustrated). Note that, the dopant of the n$^+$-GaN substrate 41 is Si, and the carrier concentration is 3 to 4×10$^{18}$ cm$^{-3}$.

Next, trimethylgallium (TMGa) and ammonia (NH$_3$) are introduced into the MOCVD apparatus respectively at flow rates of 19 μmol/min and 12 L/min, and the n$^-$-GaN layer 42 that is to be the electron transit layer is grown to a layer thickness of 10 μm. At this time, Si doping is performed with silane gas (SiH$_4$) as a source material. The flow rate of SiH$_4$ is regulated so that the Si concentration becomes 1×10$^{16}$ cm$^{-3}$.

Next, TMGa and NH$_3$ are introduced into the MOCVD apparatus respectively at flow rates of 19 μmol/min and 12 L/min, and the p-GaN layer 43 is grown to a layer thickness of 200 nm on the n$^{-1}$-GaN layer 42. At this time, the growth temperature is 1050° C. and the growth pressure is 200 Torr (2.67×10$^4$ Pa) (1 Torr=133.322 Pa). Mg, as a p-type dopant, is produced by adding biscyclopentadienylmagnesium (Cp$_2$Mg) as a source gas so that the Mg concentration becomes 1×10$^{18}$ cm$^{-3}$.

Further, the GaN layer is grown to a layer thickness of 300 nm on the p-GaN layer 43 to become a p$^+$-GaN layer 44 that will later function as a contact layer. At this tune, the growth temperature is 1050° C. and the growth pressure is 200 Torr (2.67×10$^4$ Pa). Note that, the flow rate of Cp$_2$Mg is regulated so that the Mg concentration becomes 2×10$^{19}$ cm$^{-3}$. At this time, the flow rate of NH$_3$ may be increased to more than 12 L/min, for example, 120 L/min, to allow growth in an N rich condition.

Further, doping with Zn is performed using diethyl zinc (DEZn) as a source material at the same time as doping with Mg onto the GaN layer that will later become the p$^+$-GaN layer 44. The flow rate of DEZn is regulated so that the concentration of Zn when doping alone becomes 1×10$^{19}$ cm$^{-3}$. Here, the concentration of Zn is preferably regulated so to be about the same as the concentration of Mg or lower. Note that, dimethyl zinc (DMZn) may be used as a Zn source material instead of diethyl zinc (DEZn).

When simultaneously doping Zn with Mg in this manner, the introduced Mg substitutes in all the Ga sites (Ga substitution), which are acceptor positions, and forms Mg$_{Ga}$. Meanwhile, Zn enters into an interstitial site without substituting Ga and forms Zn$_I$ and has an effect of increasing the Fermi energy of the system. Therefore, the formation of Mg$_{Ga}$ is promoted better than when doping with Mg alone thereby also increasing hole concentration. Note that, here, Zn was doped on only the GaN layer that becomes the p$^+$-GaN layer 44, but doping may be performed on the GaN layer of the previous step that becomes the p-GaN layer 43. At this time, the hole concentration of the p-GaN layer 43 is about the same as when doping with only Mg, but there is an advantage that formation of V$_N$ and Ga interstitial atoms can be suppressed.

The Zn, simultaneously doped with Mg on the GaN layer that becomes the p$^+$-GaN layer 44, can be removed after epitaxial growth by conducting a heat treatment process that heats for approximately 1 hour at a temperature of, for example, 400° C. in a vacuum of about, for example, 10$^{-6}$ Torr (1.33×10$^{-4}$ Pa). This is because not only does Zn in an interstitial site have a large diffusion coefficient, but the saturated vapor pressure of Zn is high. In this heat treatment process, heating the top surface of the p$^+$-GaN layer using, for example, an infrared heating device and cooling the back surface of the n$^+$-GaN substrate 41 so as to maintain room temperature or below enables the removal of Zn as a metal element to be more effective. This is because diffusion of Zn into the GaN layer surface can be promoted by applying a temperature gradient into the epitaxial substrate. Note that, in the event that Zn remains on the GaN layer surface, it can be removed by washing with a solution of hydrochloric acid or the like. After the heat treatment process to remove Zn, the concentration of Zn in the GaN layer is $^1\!/_{100}$ or less than the concentration of Mg. Further, in the heat treatment process, Mg in the GaN layer is activated as an acceptor, and the p$^+$-GaN layer 44 is formed. In other words, it is such that as few as possible impurity atoms remain other than Mg in the p$^+$-GaN layer 44 after activation of Mg.

In this first embodiment, a one digit increase was made possible in the hole concentration of the p$^+$-GaN layer 44 to 2×10$^{17}$ cm$^{-3}$ by simultaneously doping Zn with Mg on the GaN layer that later becomes the p$^+$-GaN layer 44 in contrast to the conventional method of doping only Mg in which the hole concentration of the p$^+$-GaN layer is about 5×10$^{16}$ cm$^{-3}$. According to the above, the epitaxial substrate of the first embodiment can be produced.

(Fabrication of the Element)

After the epitaxial substrate is produced, the element can be fabricated. In other words, an SiO$_2$ film (not illustrated) is formed on the p$_+$-GaN layer 44 using, for example, a plasma CVD method. Next, by using, for example, a sputtering method, a Ti film with a layer thickness of 25 nm and an Al film with a layer thickness of 300 nm are layered in order on the back surface of the n$^+$-GaN substrate 41 of the epitaxial substrate to form the cathode electrode 4C.

Next, a photoresist is applied on the SiO$_2$ film that is on the p$^+$-GaN layer 44, patterning is performed via photolithography, and an open portion is formed on the SiO$_2$ film in a formation position of the anode electrode 4A using a hydrofluoric acid-based solution. Next, the anode electrode 4A is formed on the p$^+$-GaN layer 44 by sequentially layering a Pt having a layer thickness of 100 nm and Au having a layer thickness of 300 nm using, for example, a sputtering method. Note that, instead of Pt, Ni or Pd may be used as material for the anode electrode 4A. Afterwards, the SiO$_2$ film is removed. After formation of the cathode electrode 4C and the anode electrode 4A, ohmic characteristics favorable to the electrodes were attained by conducting heat treatment on the epitaxial substrate, for example, for 30 min at 700° C. to produce the pn junction diode according to the first embodiment.

The pn junction diode produced as described above exhibits favorable rectifier characteristics and has withstand voltage of 600 V or more. The pn junction diode simultaneously doped with Mg and Zn, compared to a pn junction diode doped with only Mg, has a higher on-current due to higher hole concentration, and a lower leakage current due to lower Ga interstitial atom concentration and $V_N$ concentration and is able to suppress characteristic fluctuation due to long term electrification.

Second Embodiment

Figure 5:
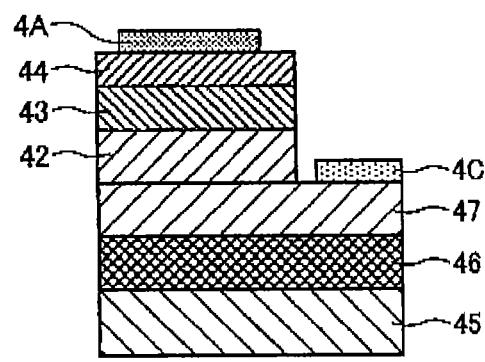
FIG. 5 is a cross-sectional view illustrating a pseudo vertical type pn diode according to a second embodiment of the present invention.

Next, a description will be given of a nitride semiconductor device according to a second embodiment of the present invention. FIG. 5 is a cross-sectional view of a pseudo-vertical type rectifier (pn junction) diode having a modified form from the first embodiment described above.

As illustrated in FIG. 5, the pseudo-vertical type pn junction diode according to the second embodiment is provided with, in order on a sapphire substrate 45, a buffer layer 46 and an $n^+$-GaN layer 47. An $n^-$-GaN layer 42, a p-GaN layer 43, and a $p^+$-GaN layer 44 are sequentially provided in a section on the $n^+$-GaN layer 47. The anode electrode 4A is provided on the $p^+$-GaN layer 44. Further, the cathode electrode 4C is provided on the $n^+$-GaN layer 47 in the section where the $n^-$-GaN layer 42, the p-GaN layer 43, and the $p^+$-GaN Layer 44 were removed. Next, the following is a description of a manufacturing method of the pseudo-vertical type pn junction diode as configured above according to the second embodiment.

In other words, first, the $n^+$-GaN layer 47 is epitaxially grown via the buffer layer 46 on the sapphire substrate 45. Note that, an AlN layer or low temperature grown GaN layer formed by conventionally known methods may be used as the buffer layer 46. Furthermore, the $n^+$-GaN layer 47 is doped with Si using $SiH_4$. Note that the epitaxial structure of the upper part from the $n^-$-GaN layer 42, which is an electron transit layer, is similar to that in the first embodiment and the description thereof is omitted.

(Fabrication of the Element)

After the epitaxial substrate is produced, the element is fabricated. In other words, in the element fabrication process, a portion of epitaxial substrate is etched out using dry etching, and the cathode electrode 4C is formed on the exposed $n^+$-GaN layer 47. Other such manufacturing methods are similar to that given in the first embodiment and the descriptions thereof are omitted.

In the pseudo-vertical type pn junction diode manufactured as described above, a similar effect as that in the first embodiment can be obtained by simultaneously doping Zn with Mg on the $p^+$-GaN layer 44.

Third Embodiment

Figure 6:
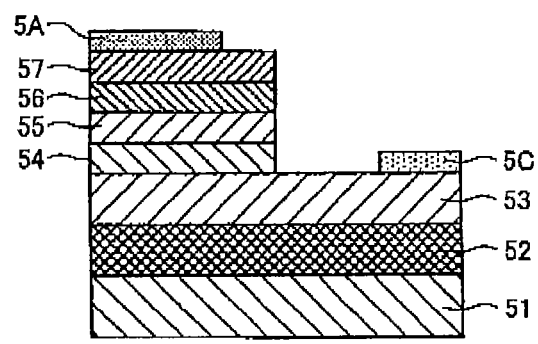
FIG. 6 is a cross-sectional view illustrating a light emitting diode according to a third embodiment of the present invention.

Next, a description will be given of a nitride semiconductor device according to a third embodiment of the present invention. Note that in the third embodiment to be described below, a description will be given of an example where the nitride semiconductor device is a light emitting diode, but it is not always limited to a light emitting diode and may be, for example, a laser diode or other type of light emitting device. FIG. 6 is a cross-sectional view of a light emitting diode (LED) element according to the third embodiment.

As illustrated in FIG. 6, in the LED element according to the third embodiment is provided with, in order on a sapphire substrate 51, a buffer layer 52 and an $n^+$-GaN layer 53. An n-GaN cladding layer 54, active layer 55, p-GaN cladding layer 56, and a $p^+$-GaN layer 57 are sequentially provided in a section on an $n^+$-GaN layer 53. An anode electrode 5A is provided on the $p^+$-GaN layer 57.

Further, a cathode electrode 5C is provided on the $n^+$-GaN layer 53 in the section where the n-GaN cladding layer 54, active layer 55, p-GaN cladding layer 56, and the $p^+$-GaN layer 57 were removed. Note that this LED element may be configured for blue light emission by using a quantum well structure of InGaN on the active layer 55. Next, the following is a description of a manufacturing method of the LED element as configured above according to the third embodiment.

(Epitaxial Substrate Production)

In other words, a single crystal sapphire substrate 51 having a thickness of 500 μm and 2 inches (50.8 mm) in diameter with an "a" face as its main face is installed in an MOCVD apparatus (not illustrated). Next, TMGa and $NH_3$ are introduced into the MOCVD apparatus respectively at flow rates of 14 μmol/min and 12 L/min, and the buffer layer 52 composed of a low temperature growth GaN with a layer thickness of 30 nm is epitaxially grown. Here, the growth temperature is, for example, 550° C.

Next, TMGa and $NH_3$ are introduced into the MOCVD apparatus respectively at flow rates of 58 μmol/min and 12 L/min, and the $n^+$-GaN layer 53 with a layer thickness of 1 μm is layered on the buffer layer 52 to become a contact layer for the cathode electrode 5C. Here, the growth pressure is 200 Torr ($2.67 \times 10^4$ Pa) and the growth temperature is 1050° C., and when adding an Si dopant, the flow rate of $SiH_4$ is regulated so that n-type carrier concentration becomes $2 \times 10^{18}$ cm$^{-3}$.

Next, the sapphire substrate 51 is heated to 1100° C. Next, TMGa and $NH_3$ are introduced into the MOCVD apparatus respectively at flow rates of 60 μmol/min and 15 L/min, and the n-GaN cladding layer 54 with a layer thickness of 1 μm is layered on the $n^+$-GaN layer 53 and allowed to epitaxially grow. Note that, with the n-GaN cladding layer 54, Si is added so that the carrier concentration becomes $5 \times 10_{17}$ cm$^{-3}$ using $SiH^4$ as the source material.

Thereafter, maintaining the temperature of the sapphire substrate 51 at 1100° C., two layers of sequentially alternating barrier layers of 10 nm composed of GaN and well layers of 10 nm composed of $In_{0.15}Ga_{0.85}N$ are layered on the n-GaN cladding layer 54 to form the active layer 55. Here, trimethylindium (TMI) is used as the source material for In. Furthermore, TMI, TMGa, and $NH_3$ are introduced into the MOCVD apparatus at the time of forming the well layer respectively at flow rates of 15 μmol/min, 19 μmol/min, and 12 L/min. Note that, in order to raise the emission efficiency in the well layer, approximately $5 \times 10_{17}$ cm$^{-3}$ of Zn and Si may be added using DEZn and $SiH^4$ as the source materials.

Next, TMGa and $NH_3$ are introduced into the MOCVD apparatus respectively at flow rates of 19 μmol/min and 12 L/min, and the p-GaN cladding layer 56 with a layer thickness of 20 nm is epitaxially grown on the active layer 55. Here, Mg as a p-type dopant is added onto the p-GaN cladding layer 56 so that the concentration of Mg becomes $1 \times 10_{18}$ cm$^{-3}$ using $Cp^2Mg$ as the source gas.

Next, the temperature of the sapphire substrate 51 is lowered to 1050° C. Further, TMGa and $NH_3$ are introduced into the MOCVD apparatus respectively at flow rates of 19 μmol/min and 12 L/min, and the GaN layer that will later become the p+-GaN layer 57 to function as a contact layer is epitaxially grown to a layer thickness of 200 nm on the p-GaN cladding layer.

Here, Cp$_2$Mg is introduced into the MOCVD apparatus as the source gas of Mg. The flow rate of the source gas is regulated so that the concentration of Mg in the p+-GaN layer 57 becomes $2 \times 10^{20}$ cm$^{-3}$. In addition, methyl lithium (MeLi) was introduced as the source gas for Li at the same time as Cp$_2$Mg. The flow rate of MeLi was regulated so that the concentration of Li becomes $1 \times 10^{20}$ cm$^{-3}$ when only Li is doped. Here, the concentration of Li is preferably regulated so as to be the concentration of Mg or lower.

When doping Li at the same time as Mg on the GaN layer that is to become later the p+-GaN layer 57, the introduced Mg substitutes in the Ga sites which are acceptor positions. Accordingly, a so-called Mg$_{Ga}$ formation is performed. Meanwhile, Li enters into an interstitial site without substituting Ga, and a so-called Li$_I$ formation is performed to supply the donor. By this, the Fermi energy of the system is increased, and the formation of Mg$_{Ga}$ is promoted to also increase the hole concentration compared to when Mg is doped alone.

Further, in the third embodiment, the doping of Li performed at the same time as the doping of the p-type dopant is only performed at the time of forming the p+-GaN layer 57, but it may also be performed at the time of forming the p-GaN cladding layer 56. At this time, the hole concentration of the p-GaN cladding layer 56 is about the same as when doping with only Mg, but there is an advantage that formation of V$_N$ and Ga interstitial atoms can be suppressed.

Further, the p-cladding layer is configured of GaN as with the p-GaN cladding layer 56, but AlGaN or InGaN may also be used, and also in such case, the effects of simultaneously doping Mg, Zn, and Li as necessary, can be obtained.

The Li doped simultaneously with Mg can be segregated on the surface after epitaxial growth by performing a heat treatment process that heats the substrate for approximately one hour at a temperature of about 400° C. in a nitrogen atmosphere. This is because Li has a large diffusion coefficient when in an interstitial site. Li segregated on the surface can be removed by washing with a hydrochloric acid solution or the like. The Li concentration in GaN becomes 1/100 or less of the concentration of Mg.

Further, because of this heat treatment process, Mg is activated as an acceptor. In this manner, by simultaneously doping Li with Mg, the hole concentration is increased by one digit to $1 \times 10^{19}$ cm$^{-3}$ compared to the hole concentration of $1 \times 10^{18}$ cm$^{-3}$ when only Mg is doped. According to the above, the epitaxial substrate according to the third embodiment can be produced.

(Fabrication of the Element)

Next, the element is fabricated on the epitaxial substrate. In other words, first, an SiO$_2$ film (not illustrated) is formed on the p+-GaN layer 57 using, for example, a plasma CVD method. Next, a photoresist is applied on the SiO$_2$ film, patterning is performed via photolithography, and an open portion is formed in the position where the cathode electrode 5C is to be formed, using a hydrofluoric acid-based solution. Next, etching is performed to the n+-GaN layer 53 using a dry etching device.

Thereafter, Ti film having a layer thickness of 25 nm and Al film having a layer thickness of 300 nm are sequentially formed on the n+-GaN layer 53 using, for example, a sputtering method, and the cathode electrode 5C, which is an ohmic electrode, is formed.

Next, a photoresist is applied on the SiO$_2$ film, and an open portion is formed in the formation section of the anode electrode 5A through sequential exposure and development processes. Next, the anode electrode 5A is formed on the p+-GaN layer 57 by sequentially layering a Pt film having a layer thickness of 100 nm and an Au film having a layer thickness of 300 nm using a sputtering method. Note that, instead of Pt, Ni or Fd may be used as material to configure the anode electrode 5A. Furthermore, after formation of the cathode electrode 5C and the anode electrode 5A, favorable ohmic characteristics are obtained by conducting heat treatment, for example, for 30 min at 700° C. Finally, the LED element is produced by cleaving the sapphire substrate 51.

The LED element manufactured as described above had a drive current of 20 mA, an emission peak wavelength of 425 nm, and an emission intensity of 1 mW. Meanwhile, for comparison, an LED element was also manufactured in which Li was not simultaneously doped at the time of forming the p+-GaN layer 57, and in such case, the resistance increased in the p+-GaN layer 57 such that even with the same drive current, the emission intensity had a lower value of 0.2 mW. Furthermore, the LED element having the p+-GaN layer 57 simultaneously doped with Li and Mg, had a lower leakage current due to lower Ga interstitial atom concentration and V$_N$ concentration such that characteristic fluctuation due to long term electrification was suppressed.

Fourth Embodiment

Figure 7:
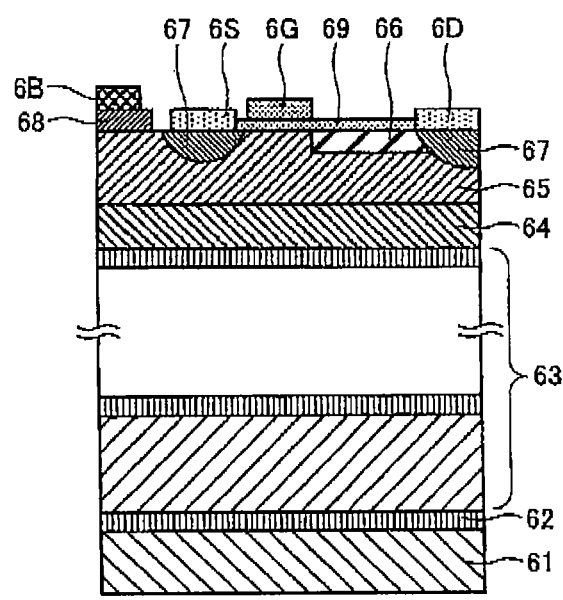
FIG. 7 is a cross-sectional view illustrating a MOSFET according to a fourth embodiment of the present invention.

Next, a description will be given of a nitride semiconductor device according to a fourth embodiment of the present invention. FIG. 7 is a cross-sectional view of the MOS type field effect transistor (MOSFET) as a nitride semiconductor device according to the fourth embodiment.

As illustrated in FIG. 7, in the MOSFET element, an AlN buffer layer 62, buffer layer 63, GaN layer 64, and a p-GaN layer 65 as an inversion layer (channel layer) are sequentially layered on an Si substrate 61. The buffer layer 63 is a layer where a composite layer of AlN/GaN is sequentially layered with a GaN layer of a layer thickness of 180 nm and an AlN layer of a layer thickness of 20 nm and is stacked in, for example, 12 layers.

Further, on an upper portion of the p-GaN layer 65, a pair of n+-GaN layers 67 is formed as contact layers, and an n$^-$-GaN layer 66 is formed between the pair of n+-GaN layers 67. This n$^-$-GaN layer 66 operates as an electric field relaxation layer (RESURF layer) and a drift layer. Further, a source electrode 6S is provided on one of the n+-GaN layers 67 while a drain electrode 6D is provided on the other n+-GaN layer 67.

A gate oxide film 69 is formed between the source electrode 6S and the drain electrode 6D. Moreover, a gate electrode 6G is provided on the gate oxide film 69 between the n$^-$-GaN layer 66 as a RESURF layer and the n+-GaN layer 67 as a contact layer directly below the source electrode 6S. Further, on the opposite side of the gate electrode 6G relative to the source electrode 6S, a p+-GaN layer 68 is provided on the p-GaN layer 65 as the channel layer. A body electrode 6B is provided in a section on this p+-GaN layer 68. Next, the following is a description of a manufacturing method of the MOSFET element as a nitride semiconductor device as configured above according to the fourth embodiment.

(Epitaxial Substrate Production)

In other words, first, a 4 inch (101.6 mm) diameter and 1 mm thick Si substrate 61 (surface orientation (111)) grown using a Czochralski (CZ) method is installed in an MOCVD apparatus (not illustrated). Trimethyl aluminum (TMAl) and NH$_3$ are introduced into the MOCVD apparatus respectively at flow rates of 175 μmol/min, and 35 L/min. By this, the AlN buffer layer 62 having a layer thickness of 40 nm is epitaxially grown on the Si substrate 61. Here, the growth temperature is 1000° C.

Continuing, an AlN/GaN composite layer where a GaN layer of, for example, 180 nm in layer thickness and an AlN layer of 20 nm in layer thickness are sequentially layered as a pair is formed as the buffer layer 63 by sequential growth repeated 12 times. Here, the growth temperature is 1050° C. and the growth pressure is 200 Torr ($2.67 \times 10^4$ Pa). Stacking this type of buffer layer 63 suppresses cracks that generate in epitaxially grown layers and also enables warpage to be controlled. Note that the flow rates of TMAl, TMGa, and $NH_3$ during formation of the AlN layer and the GaN layer are respectively 195 μmol/min, 58 μmol/min, and 12 L/min.

Next, the GaN layer 64 having a layer thickness of 100 nm is layered on the buffer layer 63. Here, the growth temperature is 1050° C. and the growth pressure is 50 Torr ($6.67 \times 10^3$ Pa). Further, the flow rates of TMGa and $NH_3$ when forming the GaN layer 64 are respectively 58 μmol/min and 12 L/min. At this time, the carbon concentration in the GaN layer 64 is not less than $1 \times 10^{18}$ cm$^{-3}$ and can reduce buffer leakage. Note that the buffer leakage can also be reduced by doping with Fe in the GaN layer 64. For example, flowing biscyclopentadienyl iron ($Cp_2Fe$) at a flow rate of 50 sccm enables doping with Fe on the GaN layer 64 at a concentration of $5 \times 10^{17}$ cm$^{-3}$.

Afterwards, TMGa and $NH_3$ are introduced respectively at flow rates of 19 μmol/min and 24 L/min, and the p-GaN layer 65 that functions as an inversion layer is grown to a layer thickness of 500 nm. Note that, at this time, the growth temperature is 1050° C. and the growth pressure is 200 Torr ($2.67 \times 10^4$ Pa). Further, in the p-GaN layer 65 as an inversion layer, Mg of a p-type dopant is added so that the acceptor concentration becomes $1 \times 10_{17}$ cm$^{-3}$ using $Cp^2Mg$ as the source gas. Furthermore, Zn is doped on the p-GaN layer 65 simultaneously when doping with Mg using DEZn as the source material. The flow rate of DEZn is regulated so that the concentration of Zn when doping alone becomes $1 \times 10^{17}$ cm$^{-3}$. Further, because mobility is reduced when the carbon concentration in the p-GaN layer 65 is higher than $1 \times 10^{17}$ cm$^{-3}$, it is made to be $1 \times 10^{17}$ cm$^{-3}$ or lower.

In this manner, by doping the p-GaN layer 65 simultaneously with Zn and Mg, the introduced Mg can be substituted into the Ga sites which are acceptor positions, and so-called $Mg_{Ga}$ formation can be performed. Therefore, segregation into the screw dislocation of Mg can be prevented and leakage current in the vertical direction can be suppressed. Further, the concentration of $V_N$ can be reduced and also buffer leakage can be reduced. Furthermore, because formation of Ga interstitial atoms is also suppressed, characteristic fluctuation due to long term electrification can also be suppressed. Note that the Zn concentration in the p-GaN layer 65 was at or below detection limits of the SIMS because the Zn in the layering of the GaN layer that is to become the p$^+$-GaN layer 68 to be described hereafter becomes diffused in the GaN layer.

Further, TMGa and $NH_3$ are introduced respectively at flow rates of 19 μmol/min and 24 L/min, and the GaN layer that will later become the p$^+$-GaN layer 68 to function as a contact layer of the body electrode 6B is epitaxially grown to a layer thickness of 50 μm on the p-GaN layer 65. Here, the growth temperature is 1050° C. and the growth pressure is 200 Torr ($2.67 \times 10^4$ Pa). Note that the flow rate of the $Cp^2Mg$ which is the source gas is regulated so that the concentration of Mg becomes $2 \times 10^{19}$ cm$_{-3}$.

At this time, Zn is doped simultaneously with Mg on the GaN layer that later becomes the p$^+$-GaN layer 68 using DEZn as the source material. The flow rate of DEZn is regulated so that the concentration of Zn when doping alone becomes $1 \times 10^{19}$ cm$^{-3}$. Note that, the concentration of Zn is preferably regulated so to be about the same as the concentration of Mg or a lower concentration.

After epitaxial growth of the GaN layer, a heat treatment process is performed on the Si substrate 61 for, for example, approximately one hour at a temperature of about 400° C. in a vacuum of about $10^{-6}$ Torr ($1.33 \times 10^{-4}$ Pa). The heat treatment process removes the Zn simultaneously doped with Mg, the Mg is activated as the acceptor, and the p$^+$-GaN layer 68 is formed.

(Ion Implantation Process)

After epitaxial growth, an $SiO_2$ film (not illustrated) is formed on the p$^{30}$-GaN layer 68 using, for example, a plasma CVD method. Next, a photoresist is applied on the $SiO_2$ film, and patterning is performed via photolithography. Further, using a hydrofluoric acid-based solution, an opening is formed in a region that includes the n$^-$-GaN layer 66 that functions as an electric field relaxation layer (RESURF layer) and the n$^+$-GaN layer 67 that functions as a contact layer. Thereafter, using a dry etching device (not illustrated), the p$^+$-GaN layer 68 in the opening is removed by etching.

Thereafter, the n$^-$-GaN layer 66 and the n$^+$-GaN layer 67 is formed by an ion implantation method. Note that, the type of ions used in this ion implantation method is Si. Further, the acceleration voltage and implantation amount in the ion implantation method are regulated so that the carrier concentration and thickness of the n$^-$-GaN layer 66 become $5 \times 10^{18}$ cm$^{-3}$ and 50 nm, respectively. Further, the implantation amount in the ion implantation method is regulated so that the carrier concentration of the n$^+$-GaN layer 67 becomes $5 \times 10^{18}$ cm$^{-3}$. Afterwards, in order to recover the irradiation damage due to the ion implantation method, a heat treatment is performed on the Si substrate 61 for, for example, one hour at approximately 800 to 900° C. According to the above, the epitaxial substrate according to the fourth embodiment can be produced.

(Fabrication of the Element)

Next, the element is fabricated on the epitaxial substrate. In other words, first, a gate oxide film 69 composed of $SiO_2$ of a layer thickness of, for example, 60 nm is formed on the epitaxial substrate after ion implantation using an atmospheric pressure CVD method. Next, a photoresist is applied to the surface of the gate oxide film 69, and openings are formed in the formation regions of the source electrode 6S, drain electrode 6D, and body electrode 6B through an exposure process and a development process.

Next, using a sputtering method, a Ti film having a layer thickness of 25 nm and an Al film having a layer thickness of 300 nm are sequentially layered to form ohmic electrodes that will become the source electrode 6S and the drain electrode 6D. Further, the body electrode 6B is formed on the p$^+$-GaN layer 68 by sequentially layering a Pt film having a layer thickness of 100 nm and an Au film having a layer thickness of 200 nm using a sputtering method.

After these source electrode 6S, drain electrode 6D, and body electrode 6B are formed, heat treatment is performed for 30 min. at approximately 700° C. By this, favorable ohmic characteristics are obtained in these electrodes.

Finally, using, for example, a low pressure CVD method, p-type phosphorus (P) doped polysilicon (polycrystalline Si) is formed as the gate electrode 6G on the gate oxide film 69 composed of $SiO_2$. Here, the distance between the gate and source electrodes and the distance between the gate and drain are 5 μm and 20 μm, respectively, and the gate length is 2 μm, and the gate width is 0.2 mm. According to the above, the MOSFET according to the fourth embodiment can be produced.

The MOSFET manufactured as described above is an element having high withstand pressure and high reliability whose characteristics do not change even with long term electrification. Furthermore, by simultaneously doping Zn with Mg at the formation time of the p$^+$-GaN layer 68, the hole concentration is higher compared to when doping with Mg alone. By this, contact resistance between the p$^+$-GaN layer 68 and the body electrode 6B can be reduced. As a result, hole withdrawal from the body electrode 6B effectively works thereby improving the tolerance of the MOSFET element. Furthermore, polarity reversal due to anti-phase boundary generation that occurs when doping only Mg can also be prevented.

Fifth Embodiment

Figure 8:
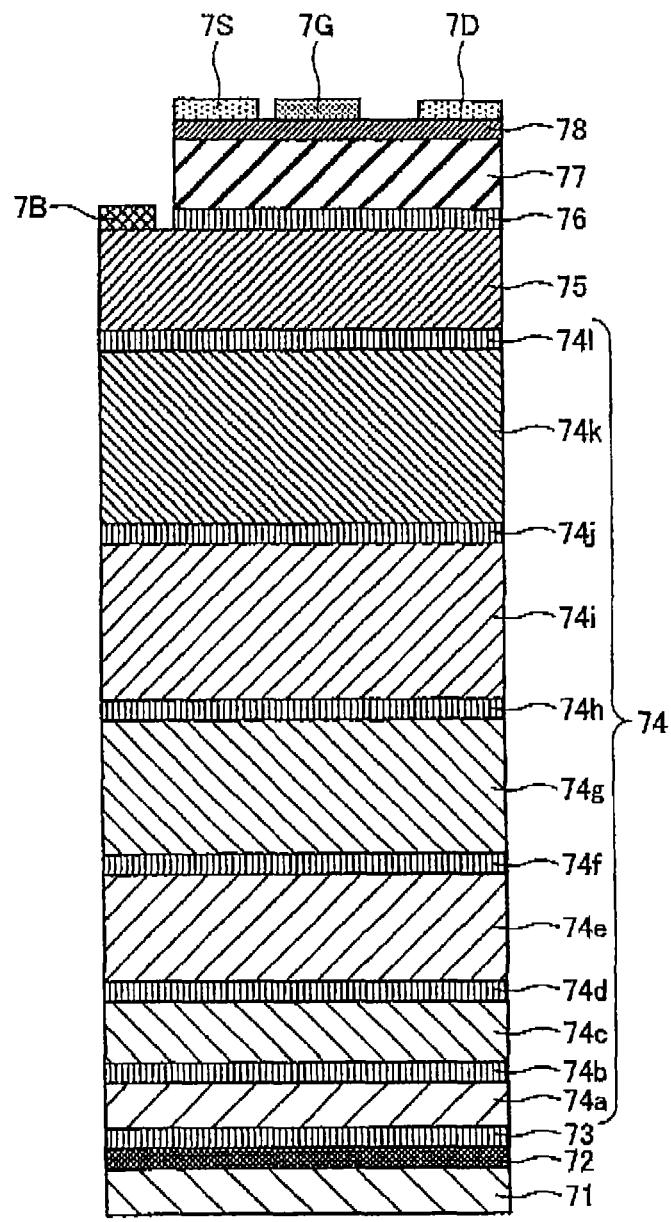
FIG. 8 is a cross-sectional view illustrating an AlGaN/GaN-HFET according to a fifth embodiment of the present invention.

Next, a description will be given of a nitride semiconductor device according to a fifth embodiment of the present invention. FIG. 8 is a cross-sectional view of an AlGaN/GaN-HFET as a nitride semiconductor device according to the fifth embodiment.

As illustrated in FIG. 8, in the AlGaN/GaN-HFET according to the fifth embodiment, a nitride silicon (SiN) layer 72, an AlN seed layer 73, a buffer layer 74, and a p$^+$-GaN layer 75 are sequentially layered on an Si substrate 71. Of these, the buffer layer 74 is configured by sequentially layering, for example, a GaN layer 74a, an AlN layer 74b, a GaN layer 74c, an AlN layer 74d, a GaN layer 74e, an AlN layer 74f, a GaN layer 74g, an AlN layer 74h, a GaN layer 74i, an AlN layer 74j, a GaN layer 74k, and an AlN layer 74l. Note that, the layer thicknesses of all of the AlN layers 74b, 74d, 74f, 74h, 74j, and 74l are, for example, 50 nm. Furthermore, the respective layer thicknesses in the GaN layers are such that the GaN layer 74a is 290 nm, the GaN layer 74c is 340 nm, the GaN layer 74e is 390 nm, the GaN layer 74g is 450 nm, the GaN layer 74i is 560 nm, and the GaN layer 74k is 720 nm.

An AlN layer 76, electron transit layer 77, and electron supply layer 78 are sequentially layered in a section on the p$^+$-GaN layer 75. On the upper face of the electron supply layer 78, a source electrode 7S, a gate electrode 7G, and a drain electrode 7D are provided mutually separated. Furthermore, on the p$^+$-GaN layer 75, a body electrode 7B is formed in a section where the AlN layer 76, the electron transit layer 77, and the electron supply layer 78 have been removed and are not provided. According to the above, the AlGaN/GaN-HFET is configured.

In this AlGaN/GaN-HFET, use of two-dimensional electron gas generated on the electron transit layer 77 made up of GaN enables a low on-resistance to be realized. Further, configuring the p$^+$-GaN layer 75 so as to be on the lower portion of the electron transit layer 77 enables a high tolerance by withdrawing holes from the body electrode 7B to be realized. Next, the following is a description of a manufacturing method of the AlGaN/GaN-HFET as configured above according to the fifth embodiment.

(Epitaxial Substrate Production)

First, ammonia (NH$_3$) is introduced for 0.3 minutes at a flow rate of 35 L/min and at a temperature of 1000° C. into a MOCVD apparatus (not illustrated) that is installed with an Si substrate 71 (surface orientation (110)) having a 4 inch diameter and a thickness of 1 mm that was grown using the CZ method. By this, the SiN layer 72 is formed on the Si substrate 71. Note that, using a surface orientation of (110) for the substrate as the Si substrate 71, compared to a surface orientation of (111) for the substrate, allows dislocation density due to epitaxial growth of each layer, as described hereinafter, to be reduced as well as allows warpage to be suppressed.

Next, supplying TMAl and NH$_3$, respectively, at flow rates of 175 μmol/min and 35 L/min, enables epitaxial growth of the AlN seed layer 73 with a layer thickness of 40 nm on the SiN layer 72. Here, the growth temperature is 1000° C.

Next, the buffer layer 74 is formed by repeating sequential layering of composite layers of the GaN layer and the AlN layer on the AlN seed layer 73. Stacking this type of buffer layer 74 suppresses cracks that generate in epitaxially grown layers and also enables warpage to be controlled. Further, the layer thicknesses of the GaN layers gradually get thicker as they are sequentially stacked from the Si substrate 71 side. Doing this increases the suppression effect on cracking and the suppression effect on warpage, and epitaxially grown layers may be stacked even thicker. Note that the flow rates of TMAl, TMGa, and NH$_3$ during formation of the AlN layer and the GaN layer are respectively 195 μmol/min, 58 μmol/min, and 12 L/min.

Next, a GaN layer that is to later become the p$^+$-GaN layer 75 is formed at a layer thickness of 600 nm on the buffer layer 74. Here, the growth temperature is 1050° C. and the growth pressure is 50 Torr (6.67×10$^3$ Pa). When forming this GaN layer, the flow rates of TMGa and NH$_3$ are respectively 58 μmol/min and 120 L/min, which is an N rich condition compared to when forming the buffer layer 74. Growing the GaN layer, that is to later become the p$^+$-GaN layer 75, in a more N rich condition than at the time of forming the buffer layer 74 in this manner, allows formation of V$_N$ to be suppressed thereby reducing leakage current.

Furthermore, the flow rate of Cp$_2$ Mg onto the GaN layer that is to later become the p$^+$-GaN layer 75 is regulated so that the internal Mg concentration becomes 2×10$^{19}$ cm$^{-3}$, and Zn is simultaneously doped when Mg is doped, using DEZn as the source material. Here, the flow rate of DEZn is regulated so that the concentration of Zn when doping alone becomes 1×10$^{19}$ cm$^{-3}$. At this time, the concentration of Zn is preferably regulated so as to be the concentration of Mg or lower.

By simultaneously doping with Zn and Mg in this manner, the activation rate as an acceptor in the GaN layer is higher compared to when doping with Mg alone, and therefore, hole withdrawal from the body electrode 7B works effectively to improve tolerance of the element. Further, Mg segregation into the screw dislocation (core) that exists at high densities (approximately 10$^9$ cm$^{-2}$) and that occurs from differences in the lattice constant when the GaN layer is stacked on the Si substrate 71, can also be suppressed. Therefore, leakage current in the vertical direction can be reduced. Furthermore, polarity reversal due to anti-phase boundary generation that occurs when doping only Mg can also be prevented.

After formation of the GaN layer that is to later become the p$^+$-GaN layer 75, the process for epitaxial growth is temporarily interrupted in order to perform a process for removing Zn that remains in the GaN layer. Specifically, the pressure is reduced in the MOCVD apparatus to, for example, approximately 10$^{-6}$ Torr (1.33×10$^{-4}$ Pa) to allow the Zn in the GaN layer to be removed by conducting heat treatment process for about one hour at a temperature of approximately 400° C. Note that, the removal of this Zn may be performed after removing the substrate that has the epitaxially grown layer from the MOCVD apparatus. By removing the Zn, the concentration of Zn in the GaN layer is reduced to ¹⁄₁₀₀ or below the concentration of Mg, Mg is activated as an acceptor, and the p$^+$-GaN layer 75 is formed.

Further, TMAl and NH$_3$ are introduced respectively at flow rates of 175 μmol/min and 35 L/min, and the AlN layer 76 having a layer thickness of 1 nm is epitaxially grown on the p⁺-GaN layer 75. Here, the growth temperature is 1000° C. The formation of this AlN layer 76 allows the diffusion of Mg in the p⁺-GaN layer 75 into the electron transit layer 77 made up of GaN, to be suppressed.

Next, TMGa and NH₃ are introduced respectively at flow rates of 19 μmol/min and 12 L/min, and the electron transit layer 77 made up of GaN having a layer thickness of 100 nm is epitaxially grown on the AlN layer 76. Here, the growth temperature is 1050° C. and the growth pressure is 200 Torr (2.67×10⁴ Pa). Further, when taking into account that the carbon concentration, of the electron transit layer 77 does not have an adverse effect on two-dimensional electron gas concentration or on electron mobility, it is preferable that it be not more than $1 \times 10^{18}$ cm$^{-3}$.

Next, TMAl, TMGa, and NH₃ are introduced respectively at flow rates of 100 μmol/min, 19 μmol/min, and 12 L/min, and the AlGaN layer having a layer thickness of 25 nm is epitaxially grown on the electron transit layer 77 to form the electron supply layer 78. Here, the growth temperature is 1060° C. Further, the aluminum composition of the electron supply layer 78 is 0.22. The aluminum composition can be evaluated using x-ray diffraction. According to the above, the epitaxial substrate according to the fifth embodiment can be produced.

(Fabrication of the Element)

Next, the element is fabricated on the epitaxial substrate. In other words, the element can be produced by patterning the AlGaN/GaN-HFET using an ordinary photolithography process. Specifically, for electrode formation, a Ti film having a layer thickness of 25 nm and an Al film having a layer thickness of 300 nm are sequentially deposited on the electron supply layer 78 to form the source electrode 7S and the drain electrode 7D which are ohmic electrodes. Note that after the source electrode 7S and the drain electrode 7D are formed by vapor deposition, a heat treatment is conducted for, for example, 30 minutes at 700° C. to obtain favorable ohmic characteristics.

Further, a Ni film having, for example, a layer thickness of 100 nm and an Au film having a layer thickness of 200 nm are sequentially deposited between the source electrode 7S and the drain electrode 7D to form the gate electrode 7G which is a Schottky electrode. The body electrode 7B is formed after the electron supply layer 78, the electron transit layer 77, and the AlN layer 76 are removed using a dry etching technique. The body electrode 7B is formed by sequentially layering the 100 nm Ni film and the 200 nm Au film on the p⁺-GaN layer 75.

The AlGaN/GaN-HFET according to the fifth embodiment is produced having a shape of, for example, a gate length of 2 μm, a gate width of 0.2 mm, and a source to drain distance of 15 μm.

Because the AlGaN/GaN-HFET manufactured as described above can maintain a withstand voltage of 1200 V or above, has a high tolerance, and also a low Ga interstitial atom density in the p⁺-GaN layer 75, characteristic fluctuation due to long term electrification can be suppressed thereby providing an element having high reliability.

Sixth Embodiment

Figure 9:
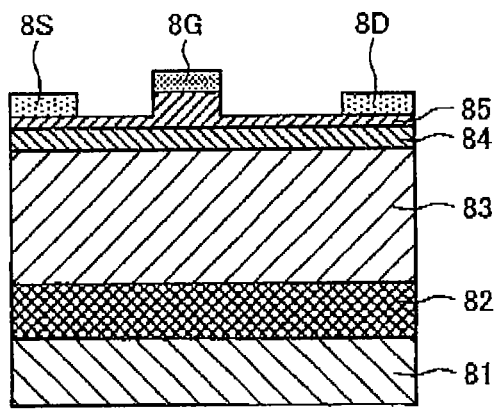
FIG. 9 is a cross-sectional view illustrating an AlGaN/GaN-HFET according to a sixth embodiment of the present invention.

Next, a description will be given of a nitride semiconductor device according to a sixth embodiment of the present invention. FIG. 9 is a cross-sectional view illustrating another example of au AlGaN/GaN-HFET as a nitride semiconductor device according to a sixth embodiment, and FIG. 10 is a cross-sectional view illustrating an epitaxial substrate formed by layering for an element production of the AlGaN/GaN-HFET.

As illustrated in FIG. 9, in the AlGaN/GaN-HFET according to the sixth embodiment, a buffer layer 82, and electron transit layer 83 made up of GaN, and a carrier supply layer 84 made up of AlGaN are sequentially layered on a sapphire substrate 81. Further, a patterned p⁺-GaN layer 85 is provided on the carrier supply layer 84, and a source electrode 8S, a gate electrode 8G, and a drain electrode 8D are provided on the p⁺-GaN layer 85. The AlGaN/GaN-HFET is set in normally-off operation. Note that, with a detailed description to follow, doping of Zn and Mg onto the p⁺-GaN layer 85 is conducted using an ion implantation method.

(Epitaxial Substrate Production)

Figure 10:
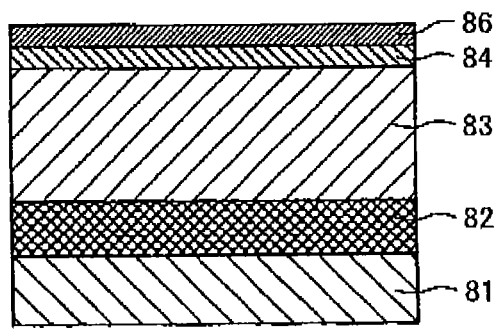
FIG. 10 is a cross-sectional view illustrating an epitaxial substrate for element production of the AlGaN/GaN-HFET of the sixth embodiment of the present invention.

First, as illustrated in FIG. 10, TMGa and NH₃ are introduced respectively at the flow rates of 14 μmol/min and 12 L/min into a MOCVD apparatus having a 2 inch diameter sapphire substrate 81 with a layer thickness of 500 μm and a "c" face as the main face installed. Accordingly, the buffer layer 82 made up of GaN with, a layer thickness of 30 nm is epitaxially grown. Here, the growth temperature is 550° C.

Next, TMGa and NH₃ are introduced respectively at flow rates of 19 μmol/min and 12 L/min, and the GaN layer with a layer thickness of 3 μm is epitaxially grown to form the electron transit layer 83. Here, the growth temperature is 1050° C. and the growth pressure is 100 Torr.

Next, TMAl, TMGa, and NH₃ are introduced respectively at flow rates of 100 μmol/min, 19 μmol/min, and 12 L/min, and the AlGaN layer having a layer thickness of 32 nm is epitaxially grown on the electron transit layer 83. Here, the growth temperature is 1050° C. Accordingly, the carrier supply layer 84 made up of AlGaN is formed. Note that the aluminum composition evaluated from the x-ray diffraction is 0.24.

TMGa, and NH₃ are introduced respectively at flow rates of 19 μmol/min and 12 L/min, and an undoped GaN layer 86 having a layer thickness of 20 nm is grown. Here, the growth temperature is 1050° C. and the growth pressure is 200 Torr (2.67×10⁴ Pa). According to the above, the epitaxially grown substrate according to the sixth embodiment illustrated in FIG. 10 can be manufactured.

(Ion Implantation Process)

Next, using an ion implantation method, ion implantation is performed on an undoped GaN layer 86. In other words, an SiO₂ film (not illustrated), having a layer thickness of 50 nm, is layered on the undoped GaN layer 86 as a surface protection film using, for example, a plasma CVD method.

Figure 11:
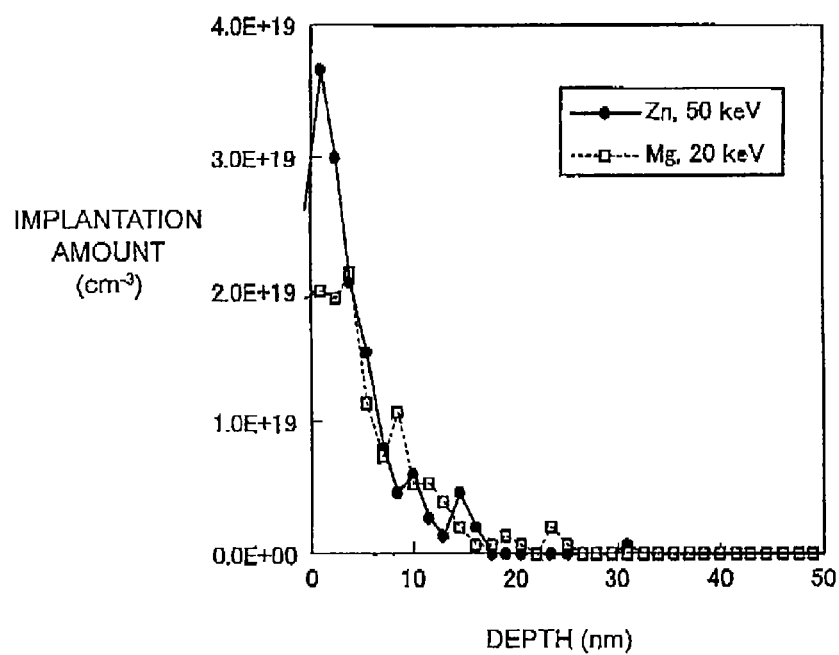
FIG. 11 is a graph showing a relationship between the implantation amount relative to depth for ion implanted zinc atoms and magnesium atoms according to an embodiment of the present invention.

Next, ion implantation is performed by implanting Zn ions and Mg ions simultaneously at acceleration voltages of 50 kV and 20 kV, respectively. Irradiation time, or beam current (flux), is regulated so that the peak value of concentration becomes approximately 2 to $3 \times 10^{19}$ cm$^{-3}$. FIG. 11 is a profile of implantation amounts of Zn ions and Mg ions calculated using a TRIM code. The origin of the horizontal axis is the surface of the GaN layer 86. From FIG. 11, it can be understood that, when Zn ions and Mg ions are implanted under the above conditions, both the Zn ions and the Mg ions are introduced only into the undoped GaN layer 86 with a layer thickness of 20 nm.

Afterwards, in order to recover the irradiation damage due to the ion implantation method, a heat treatment process is performed on the epitaxially grown substrate for, for example, one hour at approximately 800 to 900° C. Through this heat treatment process, Mg substitutes in the Ga sites which are acceptor positions, and Zn segregates on the interface of the undoped GaN layer 86 and the surface protection film. Further through this heat treatment process, Mg in the GaN layer 86 is activated as an acceptor. Thereafter, the surface protection film is removed using, for example, a hydrofluoric acid-based solution, and the epitaxially grown substrate is washed using a hydrochloric acid solution. Accordingly, the p$^+$-GaN layer 85 is formed on the epitaxial substrate surface where the segregated Zn is removed.

(Element Fabrication)

In other words, as illustrated in FIG. 9, an SiO$_2$ film (not illustrated) is formed on the p$^+$-GaN layer 85 using, for example, a plasma CVD method. Next, a photoresist is applied to the SiO$_2$ film and patterning is performed via a photolithography process, and an opening portion is formed in a section other than the formation position of the gate electrode 8G using a hydrofluoric acid-based solution.

Next, using a dry etching device, the p$^+$-GaN layer 85 is dry etched until a depth of approximately, for example, 10 nm. After dry etching, an SiO$_2$ film (not illustrated) is formed again on the p$^+$-GaN layer 85 using, for example, a plasma CVD method.

Next, a photoresist is applied to the SiO$_2$ film and patterning is performed via a photolithography process, and an opening portion is formed in the formation position of the source electrode 8S and the drain electrode 8D using a hydrofluoric acid-based solution.

Next, the source electrode 8S and the drain electrode 8D are formed by forming metal films that will be the electrodes using, for example, a sputtering method or a vacuum deposition method. The source electrode 8S and the drain electrode 8D are layered structures where, for example, a Ti film with a layer thickness of 25 nm and an Al film with a layer thickness of 300 nm are sequentially layered, and ohmic contact is made with a two-dimensional electron gas layer of the AlGaN/GaN interface.

After formation of the source electrode 8S and the drain electrode 8D, heat treatment is performed for, for example, 30 min at a temperature of 700° C. By this, favorable ohmic characteristics are obtained in the source electrode 8S and the drain electrode 8D. Furthermore, the gate electrode 8G is formed as a Schottky electrode by sequentially layering a Ni layer having a layer thickness of 100 nm and an Au layer having a layer thickness of 200 nm between the source electrode 8S and the drain electrode 8D using, for example, a sputtering method or a vacuum deposition method.

The AlGaN/GaN-HFET according to the sixth embodiment is produced having a shape of, for example, a gate length of 2 µm, a gate width of 0.2 mm, and a source to drain distance of 15 µm.

The AlGaN/GaN-HFET manufactured as described above is set in a normally-off operation and suppresses the current collapse phenomenon caused on the surface of the carrier supply layer 84 made up of AlGaN. Further, with the formation of the p$^+$-GaN layer 85, a high hole concentration can be realized in the p$^+$-GaN layer 85 by simultaneously doping Zn and Mg in the non-doped GaN layer 86 (see FIG. 10). Note that, in place of the p$^+$-GaN layer 85, a p$^+$-InGaN layer may be used. Substituting the GaN layer with an InGaN layer improves the ionization rate of the acceptor residing in the p$^+$ layer, and makes control of the threshold value easier. Further, the contact resistance of the ohmic electrodes can be reduced.

Meanwhile, for comparison, a normally-off operation was not provided in the structure illustrated in FIG. 9 when doping only with Mg on the non-doped GaN layer 86 that becomes the p$^+$-GaN layer 85. Further, in order to bring about a normally-off operation, the layer thickness of the p$^+$-GaN layer 85 of the gate side portion must be 20 nm to create a state similar to that of when dry etching is not performed, and it was confirmed that leakage current increases between the gate electrode 8G and the drain electrode 8D.

Embodiments of the present invention were described in detail above, but the present invention is not limited to the above embodiments, and various modifications are possible based on the technical concept of the present invention. For example, the numerical values given in the above embodiments are nothing more than examples, and different numerical values may be used as necessary.

For example, in the above embodiments, Zn and Li were used as metal elements for simultaneously doping with Mg on the p-GaN layer and on the p$^+$-GaN layer, but it has been confirmed that similar advantageous effects can be obtained also by using Au, Ag, Cu, Pt, or Pd. Further, similar effects may also be obtained by using AlN and/or InN, or a mixed crystal composed of a combination of at least two types selected from GaN, AlN, and InN, instead of GaN in the group III nitride semiconductor layer having p-type conductivity.

Further, for example, in the embodiments described above, an MOCVD apparatus was used when manufacturing the epitaxial substrate using a MOCVD method, but it is not necessarily limited to this. Specifically, the epitaxial substrate may be manufactured using a hydride vapor phase epitaxial growth method (HYPE), a molecular beam epitaxial growth method (MBE), or a laser ablation method.

Moreover, in the third embodiment described above, MELi is used as the organic metal source gas used when doping with Li, but it is not necessarily limited to this. Phenyllithium (PhiLi), n-butyl lithium (n-BuLi), secondary butyl lithium (sec-BuLi), tert-butyllithium (t-BuLi), or the like may also be used.

Further, in the third embodiment described above, when forming the p$^+$-GaN layer 57, Li is simultaneously doped with Mg, but a similar effect can be obtained by doping with Zn or a precious metal including Au, Ag, Cu, Pt, or Pd in place of Li. When doping with a precious metal including Au, Ag, Cu, or Pt, cyclopentadienyl M (Cp$_2$M, M=Au, Ag, Cu, Pt) may be used as an organic metal gas. Further, source gases that may be used for Cu doping include Cp$_2$Cu as well as dipivaloyl metanate copper (DPM$_2$Cu), hexafluoroacetyl copper (HFACu), or the like. Further, palladium acetate may be used as a source gas for Pd doping.

Furthermore, in the fourth embodiment described above, an Si substrate was used as the substrate, but a GaN substrate, SiC substrate, sapphire substrate, ZnO substrate, or a β-Ga$_2$O$_3$ substrate may also be used.

Furthermore, in the embodiments described above, an MOCVD method or an ion implantation method was used in the element doping of Mg, Zn, or the like, but an ion implantation method may be used instead of the MOCVD method, and an MOCVD method may be used instead of the ion implantation method, and the embodiments are not limited to these methods.

What is claimed is:

1. A method for manufacturing a nitride semiconductor device having a substrate and a group III nitride semiconductor layer having p-type conductivity on at least one layer or more formed on the substrate, the method comprising forming the group III nitride semiconductor layer having the p-type conductivity by simultaneously doping magnesium of a p-type dopant and a metal element having a formation energy of a group III element substitute higher than that of the magnesium and introducing the metal element to an interstitial site in the group III nitride semiconductor layer, wherein the metal element is at least one type of element selected from Zn, Au, Ag, Cu, Pt, and Pd.

2. The method for manufacturing a nitride semiconductor device according to claim 1, wherein the metal element is removed from the group III nitride semiconductor layer at the time of activating the magnesium as an acceptor or thereafter, and a concentration of the metal element in the group III nitride semiconductor layer is not more than $\frac{1}{100}$ of the concentration of the magnesium in the group III nitride semiconductor layer.

3. The method for manufacturing a nitride semiconductor device according to claim 2, wherein the process for removing the metal element from the group III nitride semiconductor layer is a heat treatment process.

4. The method for manufacturing a nitride semiconductor device according to claim 3, wherein, in the heat treatment process, the substrate is cooled to form a temperature gradient in the nitride semiconductor device.

5. The method for manufacturing a nitride semiconductor device according to claim 1, wherein the metal element is at least one type of element selected from Au, Ag, Cu, Pt, and Pd.

6. The method for manufacturing a nitride semiconductor device according to claim 1, wherein the group III nitride semiconductor layer having the p-type conductivity is any one of GaN, AlN, or InN, or a mixed crystal composed of a combination of any two types selected from GaN, AlN, and InN.

7. The method for manufacturing a nitride semiconductor device according to claim 1, wherein the nitride semiconductor device is a rectifier diode, field effect transistor, or light emitting device.

* * * * *